(12) United States Patent
Choi et al.

(10) Patent No.: US 10,504,800 B2
(45) Date of Patent: Dec. 10, 2019

(54) ARRAY SUBSTRATE FOR DISPLAY DEVICE AND MANUFACTURING METHOD THEREOF

(71) Applicant: LG Display Co., Ltd., Seoul (KR)

(72) Inventors: SunHyun Choi, Gyeongsangbuk-do (KR); KiTaeg Shin, Daegu (KR); ChelHee Jo, Daejeon (KR); TaeYun Roh, Gyeongsangbuk-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/110,726

(22) Filed: Aug. 23, 2018

(65) Prior Publication Data

US 2018/0366377 A1 Dec. 20, 2018

Related U.S. Application Data

(60) Continuation of application No. 15/592,624, filed on May 11, 2017, now Pat. No. 10,083,881, which is a
(Continued)

(30) Foreign Application Priority Data

Apr. 17, 2014 (KR) .................... 10-2014-0046151

(51) Int. Cl.
*H01L 21/84* (2006.01)
*G02F 1/1345* (2006.01)
(Continued)

(52) U.S. Cl.
CPC ............ *H01L 21/84* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 5,046,161 A * 9/1991 Takada .................... H01L 24/10
257/642
5,342,495 A * 8/1994 Tung ...................... C25D 17/08
204/297.03
(Continued)

FOREIGN PATENT DOCUMENTS

CN 101354513 A 1/2009
KR 100315919 B 11/2001
(Continued)

OTHER PUBLICATIONS

Communication from the European Patent Office dated Sep. 17, 2015 in counterpart European application No. 15164032.3-1904.
(Continued)

*Primary Examiner* — Anthony Ho
*Assistant Examiner* — Kevin Quinto
(74) *Attorney, Agent, or Firm* — Morgan, Lewis & Bockius LLP

(57) ABSTRACT

The present disclosure provides an array substrate for a display device and a manufacturing method thereof. A transparent electrode pattern (ITO) may be formed between a source/drain metal pattern and a passivation layer located above the source/drain metal pattern, which are formed in a passivation hole area of a non-active area of the array substrate. Accordingly, it may be possible to prevent display failure caused by a delamination phenomenon or peel-off of a material of the passivation layer due to the lack of adhesion strength between a metal layer and the passivation layer in the passivation hole area.

17 Claims, 7 Drawing Sheets

Related U.S. Application Data division of application No. 14/689,274, filed on Apr. 17, 2015, now Pat. No. 9,679,825.

(51) Int. Cl.

| | |
|---|---|
| H01L 21/283 | (2006.01) |
| H01L 21/311 | (2006.01) |
| H01L 21/3213 | (2006.01) |
| H01L 23/29 | (2006.01) |
| H01L 23/31 | (2006.01) |
| H01L 27/12 | (2006.01) |
| H01L 29/417 | (2006.01) |
| H01L 29/423 | (2006.01) |
| H01L 29/66 | (2006.01) |
| H01L 29/786 | (2006.01) |
| G02F 1/1343 | (2006.01) |
| G02F 1/1368 | (2006.01) |
| G02F 1/1333 | (2006.01) |
| H01L 21/77 | (2017.01) |

(52) U.S. Cl.
CPC .... *G02F 1/13458* (2013.01); *G02F 1/134363* (2013.01); *H01L 21/283* (2013.01); *H01L 21/31111* (2013.01); *H01L 21/31133* (2013.01); *H01L 21/32133* (2013.01); *H01L 23/291* (2013.01); *H01L 23/293* (2013.01); *H01L 23/3192* (2013.01); *H01L 27/124* (2013.01); *H01L 27/127* (2013.01); *H01L 27/1222* (2013.01); *H01L 27/1244* (2013.01); *H01L 27/1248* (2013.01); *H01L 27/1259* (2013.01); *H01L 29/41733* (2013.01); *H01L 29/42384* (2013.01); *H01L 29/66765* (2013.01); *H01L 29/78618* (2013.01); *H01L 29/78669* (2013.01); *G02F 1/133345* (2013.01); *G02F 2001/134372* (2013.01); *G02F 2201/121* (2013.01); *G02F 2201/123* (2013.01); *H01L 2021/775* (2013.01); *H01L 2924/0002* (2013.01)

(56) References Cited

U.S. PATENT DOCUMENTS

| | | | |
|---|---|---|---|
| 2002/0101547 A1* | 8/2002 | Lee | G02F 1/136204 |
| | | | 349/40 |
| 2002/0105604 A1* | 8/2002 | Ha | G02F 1/133555 |
| | | | 349/43 |
| 2004/0075782 A1 | 4/2004 | Ha et al. | |
| 2004/0125327 A1 | 7/2004 | Choi et al. | |
| 2006/0006385 A1 | 1/2006 | Park | |
| 2010/0128192 A1 | 5/2010 | Kim et al. | |

FOREIGN PATENT DOCUMENTS

| | | |
|---|---|---|
| KR | 1020100058976 A | 6/2010 |
| KR | 1020110079452 A | 7/2011 |

OTHER PUBLICATIONS

The First Office Action from The State Intellectual Property Office of People's Republic of China dated Jun. 13, 2017 in counterpart Chinese application No. 201510184664.2.

\* cited by examiner

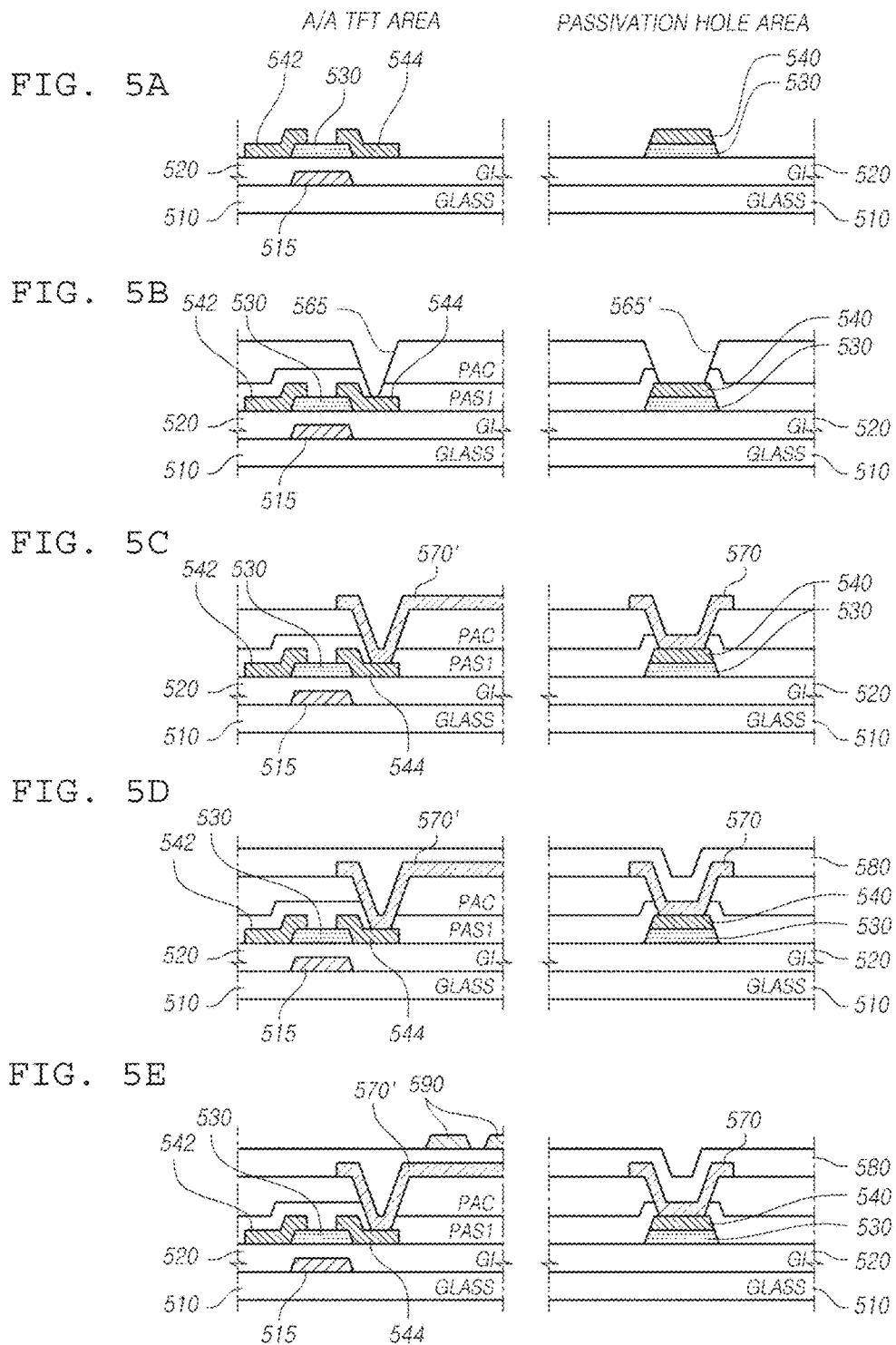

FIG. 6A
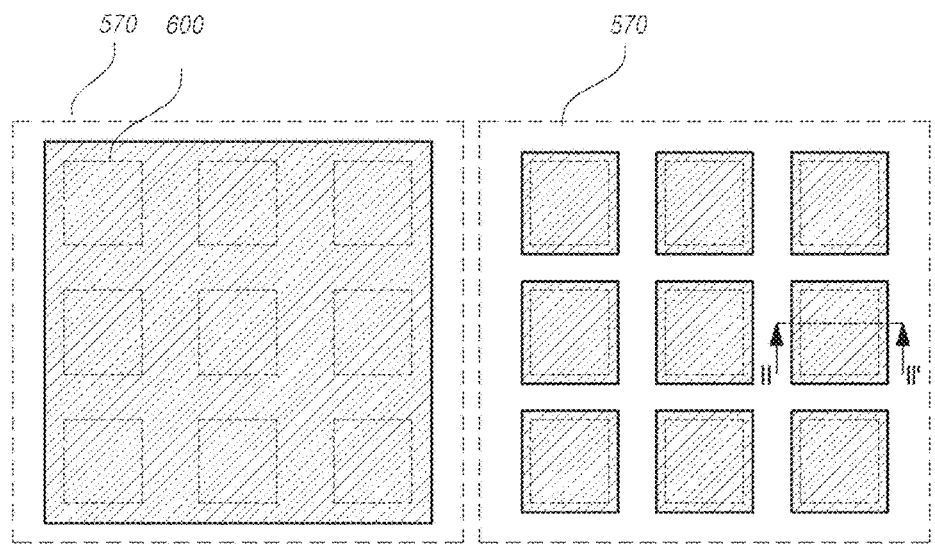
FIG. 6B
FIG. 6C
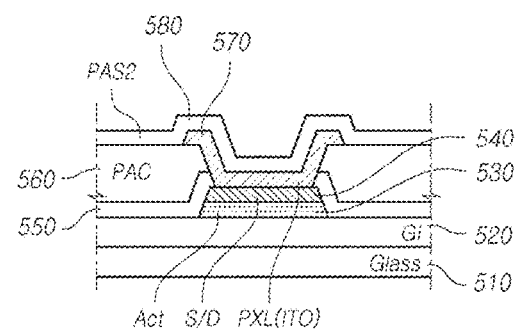
FIG. 6D
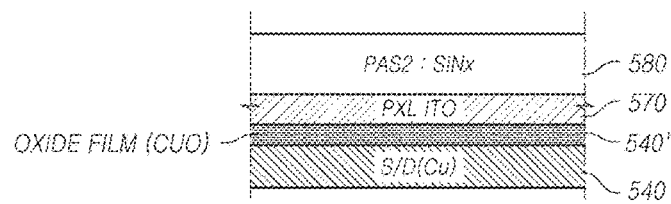

ARRAY SUBSTRATE FOR DISPLAY DEVICE AND MANUFACTURING METHOD THEREOF

CROSS-REFERENCE TO RELATED APPLICATION

This application is a continuation of U.S. patent application Ser. No. 15/592,624, filed on May 11, 2017, which is a divisional of U.S. patent application Ser. No. 14/689,274, filed on Apr. 17, 2015, which claims priority from and the benefit of Korean Patent Application No. 10-2014-0046151, filed on Apr. 17, 2014, all of which are hereby incorporated by reference for all purposes as if fully set forth herein.

BACKGROUND

1. Field of the Invention

Embodiments of the present invention relate to an array substrate for a display device and a manufacturing method thereof. More particularly, the embodiments of the present invention relate to an array substrate for a display device and a manufacturing method thereof, which can prevent problems due to the damage of a passivation layer in a passivation hole area formed on a Source/Drain (S/D) metal pattern in a non-active area.

2. Description of the Related Art

With the progress of an information-oriented society, demands for display devices for displaying images have increased in various forms. Recently, various display devices, such as a Liquid Crystal Display (LCD), a Plasma Display Panel (PDP), and an Organic Light Emitting Diode Display (OLED) device, have been utilized.

Among these display devices, a Liquid Crystal Display (LCD) device typically includes an array substrate including a Thin Film Transistor (TFT), which is a switching element for controlling on/off of each pixel area; an upper substrate including a color filter and/or a black matrix, etc.; a display panel including a liquid crystal material layer formed between the array substrate and the upper substrate; and a driving unit for controlling the TFT. In such an LCD device, an alignment state of the liquid crystal layer is controlled according to an electric field applied between a pixel (PXL) electrode and a common voltage (Vcom) electrode provided in a pixel area, and thereby the transmittance of light is adjusted to allow an image to be displayed.

In the array substrate, an Active Area (AA) and a Non-active Area (NA) may be defined. The Active Area includes one or more pixels which display an image. Multiple gate lines GL and multiple data lines DL intersect to define Pixels (P) on an inner surface of the active area of the array substrate, which is typically referred to as a "lower substrate," and each of the intersections between the gate lines and the data lines may be provided with a TFT that is respectively connected on a one-to-one ratio to a transparent pixel electrode formed in each pixel P.

On the array substrate, multiple layers, such as a gate metal layer, a semiconductor layer, a source/drain metal layer, a pixel electrode layer, a common electrode layer, and the like, may be formed in order to form the TFTs and the wire lines, and an inter-layer insulating layer for insulation between layers or a protection layer for protecting each layer may be formed.

There is also a Twisted Nematic (TN) mode, in which an array substrate having a pixel electrode formed thereon and an upper substrate having a common voltage electrode formed thereon are separated from each other, a liquid crystal material is injected between the array substrate and the upper substrate, and liquid crystal molecules in a nematic phase are driven in a direction vertical to the substrates. However, an LCD device of the above-described TN mode may be disadvantageous due to its narrow viewing angle of about 90 degrees.

In contrast, there is an LCD device of functioning in an In-Plane Switching (IPS) mode, where liquid crystal molecules may be driven in a direction horizontal to the substrates, thereby improving a viewing angle by more than 170 degrees. The LCD devices using IPS mode (in which, basically, a pixel electrode and a common voltage electrode may be simultaneously formed on a lower substrate or an array substrate) may be divided into a type in which both the pixel electrode and the common voltage electrode are formed in an identical layer, and a Fringe Field Switching (FFS) type in which both electrodes are formed spaced apart from each other in a horizontal direction in a state of interposing one or more insulating layers, and where one electrode has a finger shape.

Further, a connection pad for connection to a driving unit disposed at an inner or outer portion of the array substrate, a signal application pad for applying a reference voltage or reference signals, various pads for measurement, and the like, may be formed on a part of the non-active area outside the active area in the array substrate.

In the non-active area, multiple passivation holes or multiple passivation contact holes may be formed by opening parts of an insulating layer or a passivation layer located on an S/D metal layer laminated on the array substrate.

The passivation hole may be an aperture that exposes an S/D metal pattern due to the removal of a part of a passivation layer or an insulating layer laminated on an S/D metal pattern. In order to protect the exposed S/D metal pattern, another additional passivation layer may be formed on the passivation hole.

In the case of the passivation hole formed on the S/D metal pattern as described above, adhesion strength is weakened between the S/D metal pattern layer in a passivation hole area and the additional passivation layer, which is laminated on the S/D metal pattern layer so as to contact the S/D metal pattern layer. Thus, a delamination phenomenon may occur between both contact layers. Further, a foreign material peel-off phenomenon, in which a part of an upper passivation layer is peeled off, may occur during an additional process.

When the delamination phenomenon occurs between the S/D metal layer and the additional passivation layer located on the S/D metal layer in the passivation hole area, the accuracy of measurement may be reduced. For example, when the foreign material generated from the passivation layer by the foreign material peel-off phenomenon enters the active area and is fixed to the active area, display failures such as a pixel defect or a hot pixel (or the like) may occur.

SUMMARY OF THE INVENTION

An aspect of the present invention is to provide an array substrate for a display device and a manufacturing method thereof, which can solve problems due to the lack of adhesion strength of a metal pattern and a passivation layer located above the metal pattern in a passivation hole area formed in a non-active area of a display panel.

Another aspect of the present invention is to provide an array substrate for a display device and a manufacturing method thereof, which can prevent a delamination phenomenon and a foreign material peel-off phenomenon of a passivation layer in a passivation hole area by forming a transparent electrode pattern (ITO) between an S/D metal pattern and the passivation layer located above the S/D metal pattern which are formed in the passivation hole area.

Still another aspect of the present invention is to provide an array substrate for a display device and a manufacturing method thereof, which, in a display panel wherein a lower transparent electrode and an upper transparent electrode are all disposed on an array substrate, can prevent a delamination phenomenon and a foreign material peel-off phenomenon of a passivation layer in a passivation hole area by forming a lower transparent electrode layer as an S/D cover layer on an S/D metal pattern formed in the passivation hole area of a non-active area, and by laminating the passivation layer on the lower transparent electrode layer.

In order to solve the above-mentioned technical problems, in accordance with an aspect of the present invention, there is provided a method of manufacturing an array substrate for a display device. The method includes: a first step of forming a Gate Insulator (GI), a Source/Drain (S/D) metal pattern, and a lower passivation layer in a passivation hole area disposed in a non-active area; a second step of exposing the S/D metal pattern by removing the lower passivation layer in the passivation hole area; a third step of forming a lower transparent electrode pattern as an S/D cover layer on the exposed S/D metal pattern in the passivation hole area; and a fourth step of forming an upper passivation layer on the lower transparent electrode pattern in the passivation hole area.

In accordance with another aspect of the present invention, there is provided an array substrate for a display device that has a non-active area including a passivation hole area and an active area. The array substrate includes: an active area including a Thin Film Transistor (TFT) area in which a gate metal pattern, a Gate Insulator (GI), a semiconductor layer, a Source/Drain (S/D) metal pattern, a lower passivation layer, a lower transparent electrode layer, an upper passivation layer, and an upper transparent electrode layer are sequentially disposed; and a non-active area including a passivation hole area in which the GI, a Source/Drain (S/D) metal pattern, a lower transparent electrode pattern as a cover layer of the S/D metal pattern, and the upper passivation layer are sequentially disposed.

In accordance with still another aspect of the present invention, there is provided a method of manufacturing an array substrate for a display device that has a non-active area including a passivation hole area and an active area. The method includes: forming a gate metal pattern on the array substrate, and forming a Gate Insulator (GI) on the gate metal pattern; depositing a semiconductor layer and a Source/Drain (S/D) layer on the Gate Insulator, and forming an S/D metal pattern in both the active area and the non-active area by a photolithography process using one or more masks; depositing a lower passivation layer, and forming a passivation hole by removing a part of the lower passivation layer in the passivation hole area; depositing a lower transparent electrode layer, and patterning a lower transparent electrode pattern so as to form the lower transparent electrode pattern on the S/D metal pattern in the passivation hole area by using a lower transparent electrode mask; and forming an upper passivation layer on an entire surface of the array substrate.

According to an embodiment of the present invention, a transparent electrode pattern for increasing adhesion strength may be formed between an S/D metal layer and a passivation layer located above the S/D metal layer in an inorganic passivation hole (PAS hole) area or an organic passivation hole (PAC hole) area formed on a metal pattern such as the S/D metal layer. Accordingly, it may be possible to prevent display failure due to a delamination phenomenon or peel-off of a material of a passivation layer, which are caused by the lack of adhesion strength of a metal layer and the passivation layer in the passivation hole area.

For example, use is made of an organic insulating layer or an organic passivation layer (PAC) formed of an organic material, such as photo-acryl or the like. In a display panel where a pixel transparent electrode or a common voltage transparent electrode are simultaneously disposed on an array substrate, a transparent electrode pattern is formed between an S/D metal layer and a passivation layer located above the S/D metal layer in a passivation hole (PAC hole) area of a non-active area. Accordingly, various problems can be solved which occur when adhesion strength between an S/D metal layer and a passivation layer located on the metal layer is weakened due to an oxide layer formed in the S/D metal layer included in a pad for measurement in a process of dry-etching the organic passivation layer. Therefore, it may be possible to increase yield of liquid crystal display panels, and a reduction in failure rate thereof.

BRIEF DESCRIPTION OF THE DRAWINGS

The above and other objects, features and advantages of embodiments of the present invention will be apparent from the following detailed description taken in conjunction with the accompanying drawings, in which:

FIGS. 3 and 4 illustrate an overall flow of a method of manufacturing an array substrate for a liquid crystal display panel according to an embodiment of the present invention, in which FIG. 3 is a flowchart illustrating a process focusing on a passivation hole area and FIG. 4 is a flowchart illustrating an overall process of manufacturing the array substrate;

FIGS. 5A to 5E are cross-sectional views in a process of manufacturing an array substrate according to an embodiment of the present invention;

FIGS. 6A and 6B are plan views illustrating an array substrate manufactured according to an embodiment of the present invention, and FIGS. 6C and 6D are cross-sectional views illustrating the array substrate manufactured according to an embodiment of the present invention.

DETAILED DESCRIPTION OF THE EXEMPLARY EMBODIMENTS

Figure 1A:
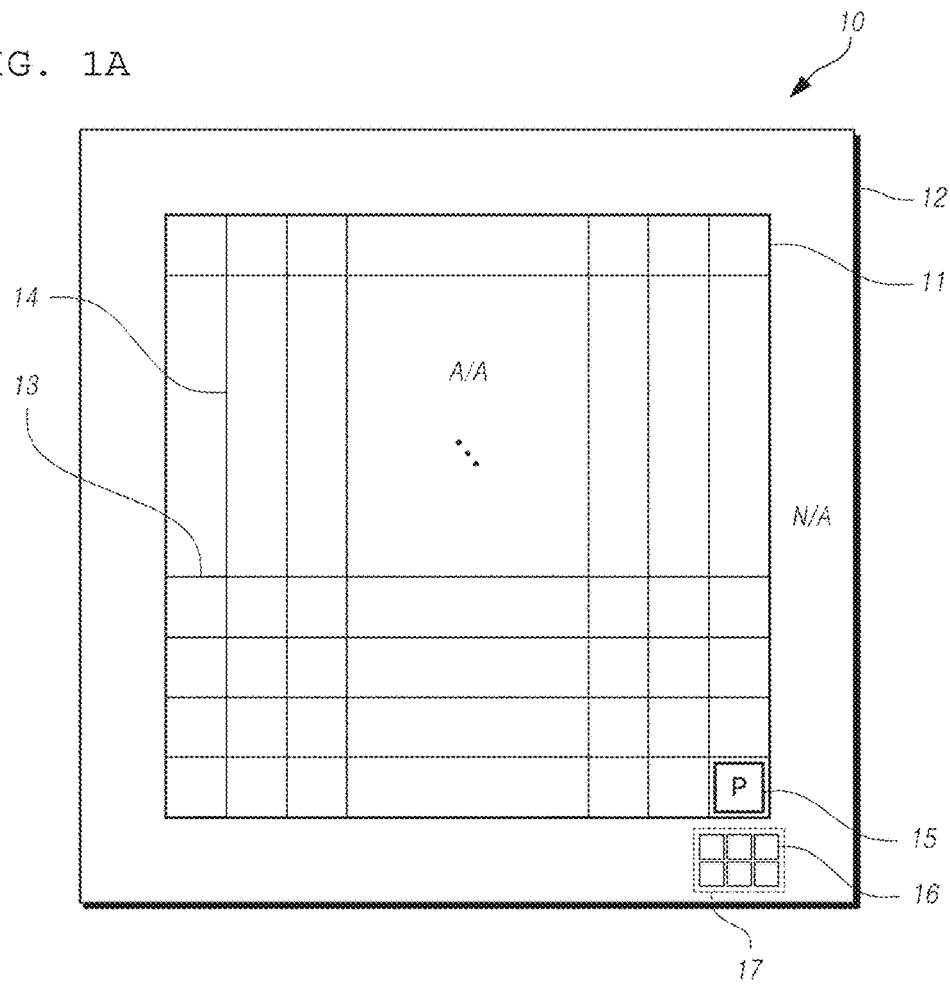
FIGS. 1A and 1B are a plan view and a cross-sectional view, respectively, illustrating an array substrate of a liquid crystal display panel to which an embodiment of the present invention is applied.

Hereinafter, embodiments of the present invention will be described in detail with reference to the accompanying drawings. In the following description, the same or similar elements will be designated by the same reference numerals to indicate the same or similar parts. Further, in the following description of embodiments of the present invention, a detailed description of known functions and configurations incorporated herein may be be omitted when it may make the subject matter of embodiments of the present invention rather unclear.

In addition, terms such as first, second, A, B, (a), (b) or the like may be used herein when describing components of embodiments of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element "may be connected to", "be coupled to", or "be in contact with" the structural elements as well as that the certain structural element is directly connected to or is in direct contact with another structural element.

Figure 1B:
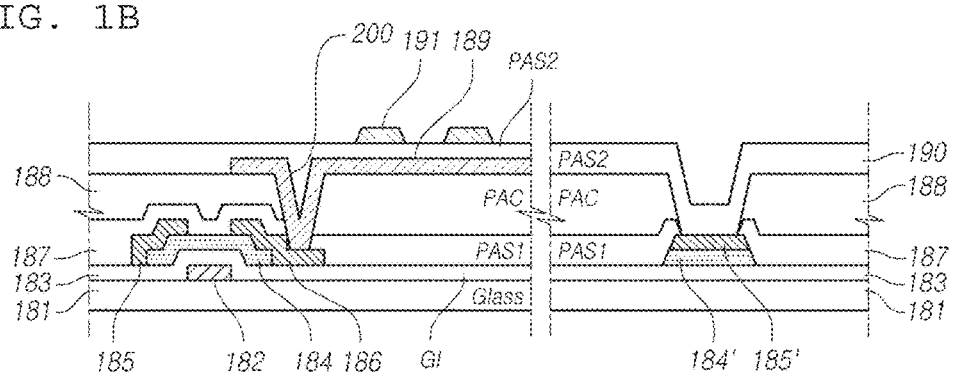

FIGS. 1A and 1B are a plan view and a cross-sectional view, respectively, illustrating an array substrate of a liquid crystal display panel to which an embodiment of the present invention is applied.

An array substrate of a liquid crystal display device, to which an embodiment of the present invention may be applied, may include an Active Area (AA) 11 including pixels 15 respectively formed in areas where multiple gate lines 13 and multiple data lines 14 intersect, and a Non-active Area (NA) 12 outside the active area.

Each pixel 15 has one or more TFTs formed therein, and includes a pixel electrode of a transparent conductive material connected to a drain electrode included in the TFT.

Meanwhile, as briefly described above, modes of the LCD device include a Twisted Nematic (TN) mode, a Vertical Alignment (VA) mode, an In-Plane Switching (IPS) mode, and a Fringe Field Switching (FFS) mode, according to schemes of adjusting the alignment of the liquid crystal layer. In the IPS and FFS modes, a pixel electrode and a common electrode are disposed on a lower substrate, and the alignment of the liquid crystal layer is adjusted by an electric field generated by a voltage difference between the pixel electrode and the common electrode.

In the IPS mode, pixel electrodes and common electrodes are alternately arranged in parallel, thereby a lateral electric field is generated between the pixel electrodes and the common electrodes, and the alignment of the liquid crystal layer is adjusted. In the IPS mode, the alignment of the liquid crystal layer is not adjusted in an upper portion over the pixel electrode and the common electrode, and thus the transmittance of light decreases in an area corresponding to the upper portion.

The FFS mode has been developed to solve the disadvantages of the IPS mode. In the FFS mode, a pixel electrode and a common electrode are formed spaced apart from each other with an insulating layer therebetween, wherein one electrode is formed in the shape or pattern of a plate, and the other electrode is formed in the shape of a finger, thereby adjusting the alignment of the liquid crystal layer through a fringe field generated between the two electrodes.

It may be desirable that the LCD device according to an embodiment of the present invention has the structure of the above-described FFS mode LCD device. However, embodiments of the present invention are not limited thereto.

Also, the LCD device to which an embodiment of the present invention is applied may include the array substrate, and a back light unit and a driving circuit unit that provide light to the liquid crystal panel. The driving circuit unit includes a timing controller (T-con), a data driver (D-IC), a gate driver (G-IC), a backlight driving unit, and a power supply unit that supplies driving power to the driving circuits. Further, the whole or part of the driving circuit unit may be formed on the liquid crystal panel by a Chip On Glass (COG) method or a Chip On Flexible printed circuit or Chip On Film (COF) method, and a description of detailed configurations of the back light unit, the driving circuit unit, and the like will be omitted.

In the cross-sectional view illustrated in FIG. 1B, as the LCD device to which an embodiment of the present invention may be applied, an example of so-called Vcom-On-Top (VOT) from among the FFS modes is illustrated in which a common voltage electrode or common electrode (Vcom) is located at the uppermost part of the array substrate or the lower substrate.

However, embodiments of the present invention are not limited to the LCD device of the VOT type and FFS mode. The LCD device of the VOT type and FFS mode will be described in more detail below.

Also, in an example of the array substrate to which an embodiment of the present invention may be applied, a lower first inorganic passivation layer (PAS1), an organic passivation layer (PAC) on the PAS1, and a second inorganic passivation layer (PAS2) on the PAC may be used as a passivation layer.

The inorganic passivation layer may be formed of an inorganic insulating material, such as silicon nitride ($SiN_x$), silicon oxide ($SiO_2$), or the like, and the organic passivation layer may be formed of a material such as photo-arcryl, acrylate, polyamide, or the like. However, embodiments of the present invention are not limited thereto.

A cross section of the array substrate to which an embodiment of the present invention may be applied will now be described in more detail. First, a gate metal layer is formed on a substrate such as an organic substrate, and a gate metal layer or a gate metal pattern including a gate electrode 182 is formed from the gate metal layer by a patterning process which includes a photolithographic process and uses a gate mask.

A Gate Insulator (GI) is formed on the gate metal layer, a semiconductor layer 184 forming a channel of a TFT is formed on the GI, and an S/D metal layer or an S/D metal pattern, which includes a source electrode 185 and a drain electrode 186, is formed on the semiconductor layer 184.

Meanwhile, while the gate metal layer, the GI, the semiconductor layer, and the S/D metal layer are formed in a TFT portion in the active area as described above, a GI, a semiconductor layer 184', and an S/D metal pattern 185' may be formed on the substrate in a passivation hole area (the right part of FIG. 1B) of the non-active area, to which an embodiment of the present invention may be applied.

In this state, a first inorganic passivation layer (PAS1) 187 and an organic passivation layer (PAC) 188 are sequentially laminated on the S/D metal pattern 185', and holes are formed by removing a part of the PAS1 187 and that of the PAC 188 through a photo process using a passivation layer mask, and the like.

For example, a drain contact hole 200 for connecting the drain electrode 186 to a pixel electrode 189 is formed in the TFT area of the active area, and a passivation hole 300 is formed in the non-active area by an identical process.

Meanwhile, in the active area, the pixel electrode 189 is formed by laminating/patterning a pixel electrode layer of a transparent electrode material on the PAC 188, and the pixel electrode 189 is electrically connected to the drain electrode 186 through the above-described drain contact hole 200.

However, during the process of patterning the pixel electrode layer, a pixel electrode pattern may not be formed in the non-active area, particularly, in an area of the passivation hole 300 of the non-active area. Accordingly, a second inorganic passivation layer (PAS2) 190 is laminated on the exposed S/D metal pattern 185' of the area of the passivation hole 300 so as to contact the exposed S/D metal pattern 185'.

Figure 2A:
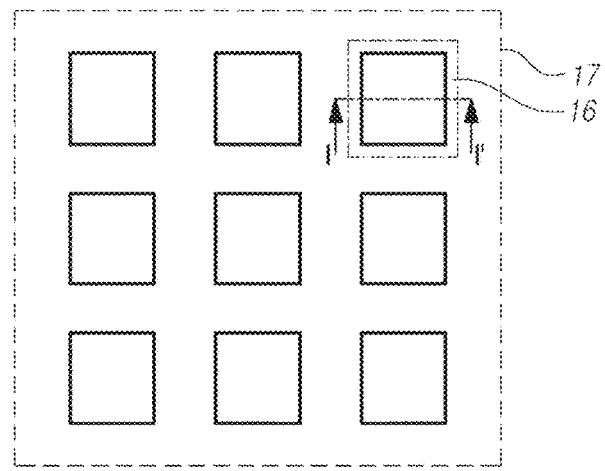
FIG. 2A is an enlarged plan view illustrating a passivation hole area, to which an embodiment of the present invention may be applied.
Figure 2B:
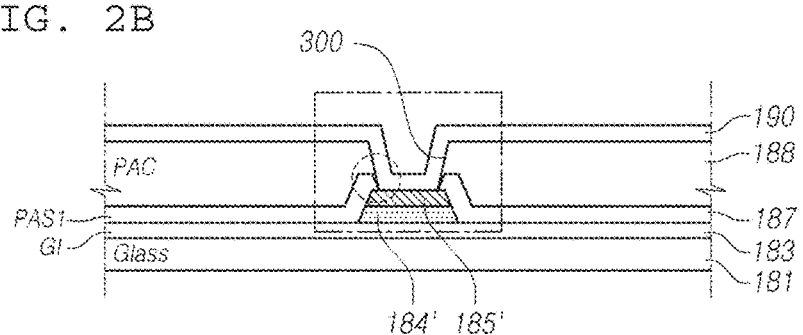
FIGS. 2B to 2D are enlarged cross-sectional views each illustrating the passivation hole area, to which an embodiment of the present invention may be applied.
Figure 2C:
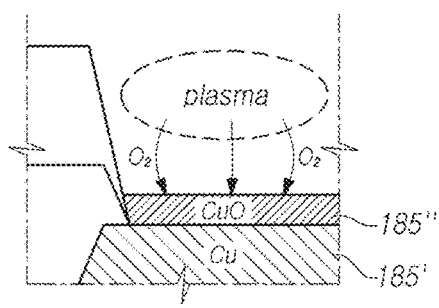
Figure 2D:
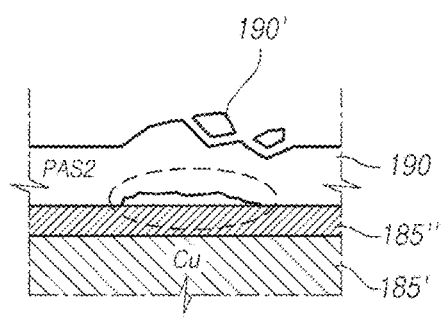

FIG. 2A is an enlarged plan view illustrating a passivation hole area to which an embodiment of the present invention may be applied, and FIGS. 2B to 2D are enlarged cross-sectional views each illustrating the passivation hole area to which an embodiment of the present invention may be applied.

As seen from the plan view, multiple passivation holes 16s may be formed in the non-active area, and an area in which the multiple passivation holes 16s are grouped may be defined as a passivation hole group area 17.

When each of the passivation holes 16 is seen from the cross section, as illustrated in FIG. 2B, an organic substrate 181, a GI 183, the semiconductor layer 184', and the S/D metal pattern 185' are formed from a lower part, and the PAS1 187 and the PAC 188 are laminated on the S/D metal pattern 185'. Then, the passivation hole 300 is formed by removing a part of the two passivation layers, and the PAS2 190 is laminated on the passivation hole 300. As can be noted from this cross-sectional structure, the S/D metal pattern 185' directly contacts the PAS2 190 in the area of the passivation hole 300. The S/D metal layer is typically formed of a metal material having low resistance, such as copper (Cu), copper alloy, aluminum (Al), aluminum alloy (AlNd), or the like, and the PAS2 is typically formed of an inorganic insulating material, such as nitride oxide ($SiN_x$) or the like. Accordingly, adhesion strength between the contact materials is weakened due to the heterogeneity of the contact materials.

Particularly, as illustrated in FIG. 2C, in order to form the passivation hole 300, the PAS1 187 and the PAC may be laminated, a photo process is performed, and dry etching is performed in order to remove passivation layers of a portion corresponding to the passivation hole 300. While the S/D metal pattern 185' exposed by the dry etching process is exposed to plasma, a metal oxide layer 185" of a predetermined thickness may be formed. For example, when the S/D metal layer is formed of copper (Cu), a copper oxide (CuO) layer which is an oxidized layer may be formed on the S/D metal layer.

Due to the metal oxide layer 185", adhesion strength between the metal oxide layer 185" and the PAS2 190 deposited on the metal oxide layer 185" may be weakened. Accordingly, as illustrated in FIG. 2D, a delamination phenomenon of a junction surface between the S/D metal pattern 185' and the PAS2 190 located above the S/D metal pattern 185' may occur in the passivation hole area. Due to the delamination phenomenon of the junction surface, a part of the PAS2 190 may be peeled off, as a passivation foreign material 190', from the PAS2 190.

As described above, damage in the passivation hole area is caused by the delamination phenomenon of the junction surface which has occurred due to the lack of the adhesion strength of the S/D metal pattern and the passivation layer located above the S/D metal pattern in the passivation hole area. For example, when the passivation foreign material 190' generated at this time enters the active area and is fixed thereto while a subsequent process is performed, the passivation foreign material 190' may cause a hot pixel or the like in the active area. Accordingly, the yield of array substrates may be reduced as a whole.

The above-described phenomenon occurs because, in the process of manufacturing the array substrate, a pixel electrode layer is formed and then a pixel electrode pattern is not generated in the passivation hole area of the non-active area during a process of patterning the pixel electrode pattern. This is because the passivation hole area of the non-active area is not patterned by using the PAC mask. and does not have the pixel electrode pattern formed therein. When a passivation hole is formed in the PAS1 and the PAC, a pixel electrode layer of a transparent conductive material is deposited on the entire substrate, and a photolithography process is performed in which, after a photoresist which is a photosensitive material is coated on the pixel electrode layer, the coated photoresist is exposed to light by using a PAC mask and is developed.

In this regard, an embodiment of the present invention may provide a method which, in order to solve the above-described problems, prevents a delamination phenomenon due to the lack of adhesion strength of an S/D metal pattern and a passivation layer in the passivation hole area, and prevents the failure of the display device due to a passivation foreign material, by forming a lower transparent electrode pattern as a cover layer of the S/D metal pattern between the S/D metal pattern and the passivation layer located above the S/D metal pattern in the passivation hole area of the non-active area of the array substrate included in the LCD panel.

Figure 3:
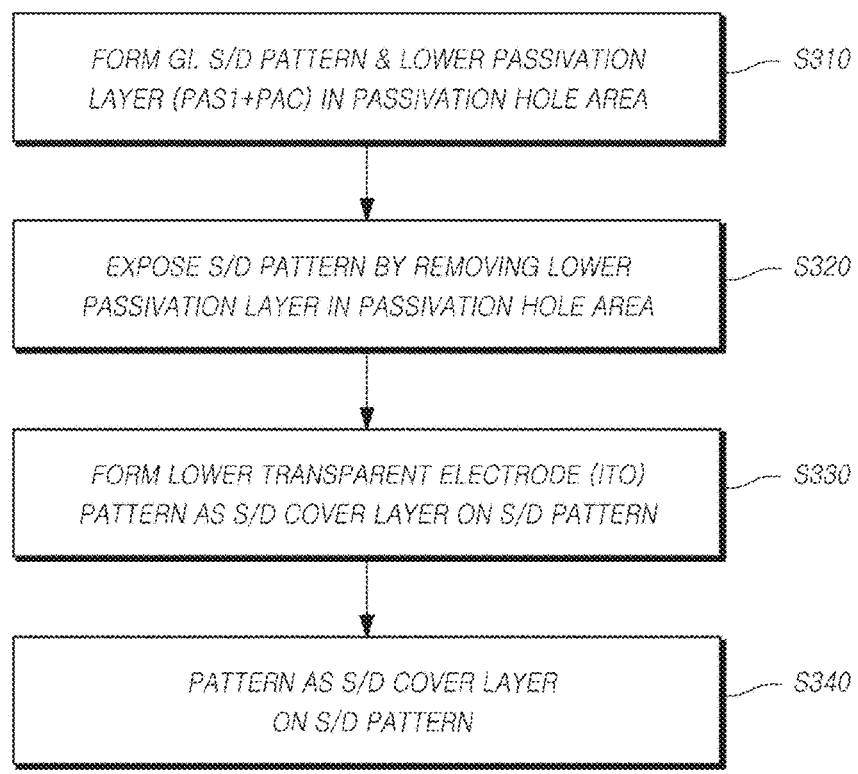
Figure 4:
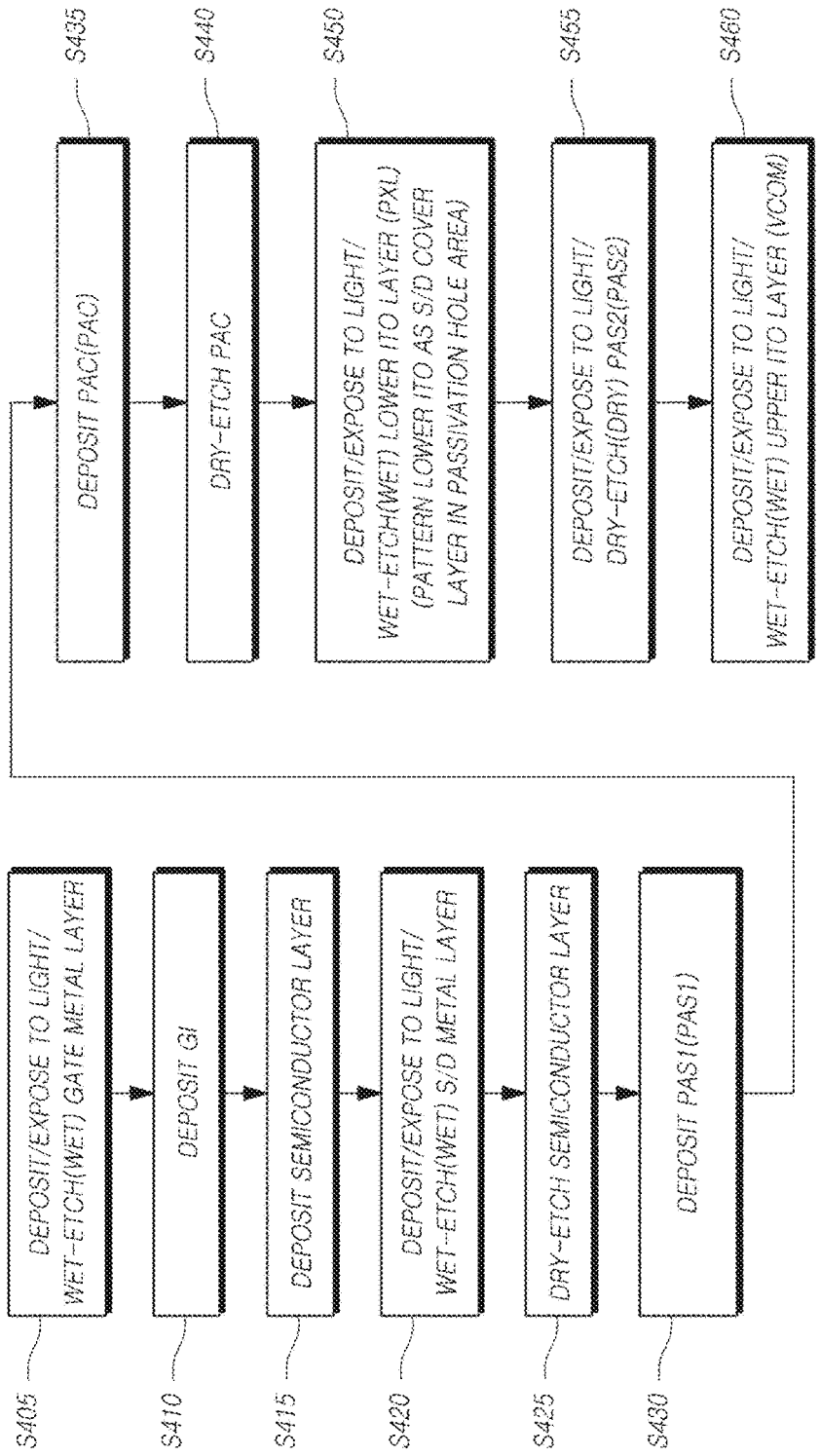

FIGS. 3 and 4 illustrate an overall flow of a method of manufacturing an array substrate for a liquid crystal display panel according to an embodiment of the present invention, in which FIG. 3 is a flowchart illustrating a process focusing on a passivation hole area, and FIG. 4 is a flowchart illustrating an overall process of manufacturing the array substrate.

With reference to FIG. 3, according to an embodiment of the present invention, a method of manufacturing a display panel that includes a non-active area including a passivation hole area and an active area, and has a gate metal pattern, a GI, a semiconductor layer, an S/D metal layer, a lower passivation layer, a lower transparent electrode layer, an upper passivation layer, and an upper transparent electrode layer sequentially formed in a TFT area of the active area, may include a first step S310 of forming a GI, an S/D metal pattern, and a lower passivation layer in the passivation hole area; second step S320 of exposing the S/D metal pattern by removing the lower passivation layer in the passivation hole area; a third step S330 of forming a lower transparent electrode pattern as an S/D cover layer on the exposed S/D metal pattern in the passivation hole area; and a fourth step S340 of forming a PAS2 as a upper passivation layer on the lower transparent electrode pattern in the passivation hole area.

According to an embodiment of the present invention, the lower passivation layer may be a double passivation layer including a PAS1 and a PAC. However, embodiments of the present invention are not limited thereto. Accordingly, the lower passivation layer may include only one or more inorganic passivation layers.

Hereinafter, a case will be described as an example in which a lower passivation layer includes a PAS1 and a PAC.

FIGS. 5A to 5E are cross-sectional views in the process of manufacturing the array substrate as illustrated in FIG. 3.

Hereinafter, a detailed configuration of each process will be described in detail with reference to FIG. 3 through FIGS. 5A to 5E.

First, in process S310 illustrated in FIG. 3, as illustrated in FIG. 5A, a gate metal pattern including a gate electrode 515 is formed on a glass substrate 510, a GI 520 is formed on the entire substrate surface on the gate metal pattern, and a semiconductor layer pattern 530 and an S/D metal pattern are formed on the GI 520.

The semiconductor layer pattern and the S/D metal pattern may be formed in both the TFT area (the left part in each of FIGS. 5A to 5E) of the active area and the passivation hole area (the right part in each of FIGS. 5A to 5E) of the non-active area. The S/D metal pattern formed in the active area includes a source electrode 542 and a drain electrode 544 that are connected to a data line (not illustrated).

The semiconductor layer pattern 530 and the S/D metal pattern 540 may also be formed in the passivation hole area of the non-active area. According to circumstances, the semiconductor layer pattern 530 may not be formed in the passivation hole area of the non-active area.

With reference to FIG. 4, process S310 illustrated in FIG. 3 will be described in more detail below.

First, as a process of forming a gate metal pattern, in step S405, a gate metal layer is deposited on the entire glass substrate 510, and then a gate metal pattern including a gate electrode 515 or the like is patterned by a photolithography process and an etching process using a gate mask or the like.

The photolithography process may be used to pattern the deposited layer to a pattern of a predetermined shape. In the photolithography process, a photoresist having photosensitivity is coated on the deposited layer, the photoresist is exposed to light such as ultraviolet rays or the like in a state of disposing a predetermined patterned mask on the photoresist (a photo process), and the photoresist is developed. As a result, only a photoresist layer corresponding to the mask pattern remains. In this state, a material of a part of the layer at which the photoresist does not remain is removed by a process such as dry etching, wet etching, or the like, and thereby only a part of the layer at which the photoresist is left unremoved remains.

A pattern corresponding to the pattern of the relevant mask may be formed on the relevant layer by the above-described processes. A type in which a part (an ultraviolet ray shield part) which is not exposed to ultraviolet rays by the mask is formed as a pattern, is a positive type. In contrast, a type in which a part (a light penetration part) exposed to light is formed as a pattern, is a negative type.

Hereinafter, the formation of a pattern on a predetermined layer by the photolithography process will be referred to as "processes of deposition, (light) exposure and etching."

Examples of the gate metal pattern patterned in step S405 may include the gate electrode 515 in the TFT area, a gate line (not illustrated) in the active area, a gate pad in the non-active area, a common electrode line (a Vcom line), or the like. However, the gate metal pattern patterned in step S405 may not be formed in the passivation hole area.

The gate metal pattern may be formed of one or more materials selected from metals having low resistance, such as copper (Cu), copper alloy, aluminum (Al), aluminum alloy (AlNd), molybdenum (Mo), and molybdenum alloy (MoTi), without being limited thereto.

After the gate metal pattern is formed as described above, the GI 520 is formed on the gate metal pattern. In step S410, the GI 520 may be formed of a material, such as silicon nitride ($SiN_x$), silicon oxide ($SiO_2$), or the like, to a thickness of several thousand Å, and may be formed by depositing tetra-ethyl-ortho-silicate (TEOS) or Middle Temperature Oxide (MTO) by a Chemical Vapor Deposition (CVD) method.

In step S415, a semiconductor layer is deposited on the GI 520. The semiconductor layer is for forming a channel between the source electrode 542 and the drain electrode 544, and may be expressed as an active layer. The semiconductor layer may formed of amorphous Silicon (a-Si) and an N+ doping layer, or may formed of molybdenum titanium (MoTi) and an N+ doping layer.

In step S420, an S/D metal layer is deposited on the semiconductor layer, and an S/D metal pattern having a predetermined pattern is formed by a photolithography process and a wet-etching process using a source mask.

The S/D metal pattern may include the source electrode 542 and the drain electrode 544 in the active area, as illustrated in FIGS. 5A to 5E, and is formed as the S/D metal pattern 540 in the passivation hole area of the non-active area, as illustrated in the right part of FIG. 5A.

As in the case of the gate metal layer, the S/D metal layer may be formed of one or more materials selected from metals having low resistance, such as copper (Cu), copper alloy, aluminum (Al), aluminum alloy (AlNd), molybdenum (Mo), and molybdenum alloy (MoTi), without being limited thereto.

The S/D metal pattern may include the source electrode 542 and the drain electrode 544 in the active area and the S/D metal pattern 540 in the non-active area, as illustrated in FIGS. 5A to 5E, and, although not illustrated, may also include data lines in the active area, a data pad in the non-active area, and the like.

The above-described source mask may be a half-tone mask or a diffraction mask. When the half-tone mask is used, by using one mask, a photolithography process, and two etching processes, the S/D metal pattern may be patterned and a semiconductor layer pattern may be patterned beneath the S/D metal pattern.

For example, after the S/D metal pattern is formed through the above-described deposition, exposure and wet etching of the S/D metal layer, in step S425, the semiconductor layer pattern illustrated in FIG. 5A may be formed by again dry-etching the semiconductor layer.

By process S420 of patterning the S/D metal pattern and the process of patterning the semiconductor layer, the semiconductor layer pattern 530 and the S/D metal pattern 540 both having a predetermined pattern are also formed in the passivation hole area of the non-active area, as illustrated in the right part of FIG. 5A.

However, the semiconductor layer pattern 530 may not be formed in the passivation hole area of the non-active area.

In step S430, a PAS1 is deposited on the entire surface of the substrate, and a PAC is deposited on the PAS1 in step S435.

The PAS1 550 may be formed of an inorganic insulating material, such as silicon nitride ($SiN_x$), to a thickness of several thousand Å and may be formed of a soluble material including silicon (Si), oxygen (O), and carbon (C), or a material such as silicide, siloxane, polyorgano siloxane, or the like.

A PAC 560 is formed of an organic insulating material having light-hardening characteristics, such as photo-acryl, benzocyclobutene (BCB), or the like, on the PAS1 550, and may have a thickness of about 1 to 2 μm, without being limited thereto.

Typically, the PAC may be thicker than the PAS1, and the material of the PAS1 may have a large electric resistance and thus has a capacitive component which is large, such as a parasitic capacitance and the like formed by the upper and lower metal patterns, whereas the photo-acryl, which may be the material of the PAC, does not allow generation of a large parasitic capacitance.

For example, a reason to use the PAC is that an organic insulating material, such as photo-acryl, has a relatively small electric resistance and a relatively large permittivity, which reduces generation of parasitic capacitance and thus is advantageous, even when the PAC is formed of the organic insulating material to a larger thickness than that of the to inorganic passivation layer or inorganic insulating film (PAS). The advantage is that the organic insulation material has light-hardening characteristics, and thus an organic insulating film, which remains immediately after exposure, development, and etching of the organic insulating material without the need to deposit a separate photoresist, can be directly used as an organic passivation layer, whereas the inorganic passivation layer (PAS) enables proceeding to a next step only after, for the patterning, a photoresist deposited on the inorganic passivation layer (PAS) is completely removed through exposure, development, etching, removal of the remaining photoresist, and the like.

However, in the case of the PAC, the PAS1 550 is used to prevent contamination of a channel and characteristic degradation of a TFT which may occur when adhesion strength between the metal layer (e.g., the S/D metal layer) and the semiconductor layer located below the PAC is reduced, and when the organic insulating material contacts the semiconductor layer material.

In the above-described case, a dual-layer structure of the PAS1 550 and the PAC 560 may be defined, as one element, to be a lower passivation layer.

However, as described above, embodiments of the present invention are not limited to the embodiments in which the lower passivation layer includes the PAS1 and the PAC, and may also include embodiments in which the lower passivation layer includes only one or more inorganic passivation layers.

Meanwhile, in step S435, the PAS1 550 and the PAC 560 are deposited, and are exposed to light by a photolithography process using a PAC mask and the like.

Because photo-acryl, which may be the material of the PAC 560, has light-hardening characteristics, a part of the material of the PAC 560 exposed to light by the PAC mask is hardened, and the PAC 560 and the PAS1 located beneath the PAC 560 are patterned by performing dry etching in this state, in step S440.

It has been described that the PAS1 and the PAC are deposited and then are simultaneously patterned by using one mask (e.g., the PAC mask) and the processes of exposure and etching. However, a masking process and processes of exposure and etching may be separately performed when a PAS1 and a PAC are patterned. For example, a process of patterning a PAS1 through deposition of the PAS1, and a photolithography process and etching using a PAS mask; and a process of patterning a PAC through deposition of the PAC, and a photolithography process and etching using a PAC mask may be separately performed.

After going through the process of patterning the PAC, as illustrated in FIG. 5B, a first aperture 565 for a drain contact hole is formed at the drain electrode portion in the TFT area of the active area, and simultaneously, a second aperture 565' for a passivation hole according to an embodiment of the present invention is formed in the non-active area.

In step S450, a lower transparent electrode layer is deposited on each of the first aperture 565 and the second aperture 565', and then is patterned.

An embodiment of the present invention may be applied to the LCD device of the IPS or FFS type, in which a transparent pixel electrode and a transparent common electrode are simultaneously formed on the array substrate which is a lower substrate. Examples of the FFS-type display panel includes a POT-type display panel, in which a transparent pixel electrode is formed on the uppermost part of the substrate in a state of interposing one inter-layer insulating layer, and a VOT-type display panel, in which a transparent common voltage electrode (Vcom) is formed on the uppermost part of the substrate.

Figure 7:
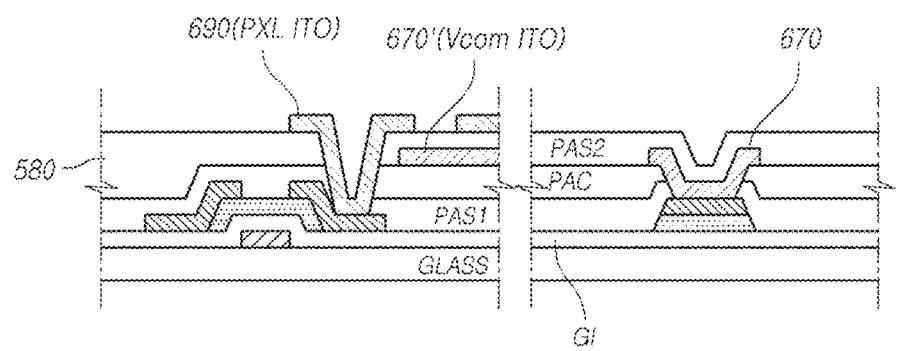
FIG. 7 is a cross-sectional view illustrating a passivation hole area according to another embodiment of the present invention, and illustrates an example applied to an LCD device of a Pixel-On-Top (POT) type.

In FIGS. 5A to 5E, an example of the VOT-type display panel is illustrated, but embodiments of the present invention are not limited thereto. As illustrated in FIG. 7 and the like, embodiments of the present invention may also be applied to the POT-type display panel and the like.

Accordingly, in an embodiment illustrated in FIG. 5, after a lower transparent electrode (ITO) layer is deposited and formed, the lower transparent electrode (ITO) layer is patterned so as to form the pixel electrode 570' in the active area, and a lower transparent electrode pattern 570 is formed on the exposed S/D metal pattern so as to contact the exposed S/D metal pattern in the passivation hole area of the non-active area.

More specifically, in a state where the drain contact hole aperture 565 in the active area and the passivation hole aperture 565' are formed by the above-described process of patterning the PAS1 and patterning the PAC, a lower transparent electrode material layer may be deposited on the entire surface of the substrate. Then, a photoresist is coated on an entire surface of the lower transparent electrode material layer, the coated photoresist is exposed to light by using a lower transparent electrode mask having a predetermined pattern formed therein, and wet-etching is performed, thereby forming the pixel electrode pattern 570', which is a lower transparent electrode pattern, and the lower transparent electrode pattern 570. Specifically, a lower transparent electrode pattern is formed as a pixel electrode (PXL) pattern in the active area, and is formed as the lower transparent electrode pattern 570 as an S/D cover layer, which covers the S/D metal pattern, in the passivation hole area of the non-active area (see step S450 and refer to FIG. 5C).

In the present example, the lower transparent electrode material may be a transparent conductive material, for example, Indium Tin Oxide (ITO) or Indium Zinc Oxide (IZO), having a relatively large work function value, without being limited thereto. For convenience, in this specification, a transparent electrode material or a transparent electrode layer will be representatively described as ITO.

As described above, differently from the example illustrated in FIGS. 2A to 2D, the lower transparent electrode pattern is also formed in the passivation hole area of the non-active area when the lower transparent electrode pattern is patterned (which becomes the pixel electrode layer in the active area in the VOT-type display panel).

In a process of forming a passivation hole having a structure as illustrated in FIGS. 2A to 2D, a mask for patterning a pixel electrode layer may not have a particular pattern formed therein in a passivation hole area of a non-active area, and thus, a lower transparent electrode pattern may not be formed in the passivation hole area. In contrast, in an embodiment illustrated in FIGS. 5A to 5E, a lower transparent electrode mask or a pixel electrode mask used during patterning a lower transparent electrode have a predetermined pattern corresponding to a passivation hole in even a passivation hole area of a non-active area, and thus allow patterning to be performed so as to form the lower transparent electrode pattern 570 as a cover layer, which covers the exposed S/D metal pattern 540, in even the passivation hole area of the non-active area.

The lower transparent electrode pattern 570 in the passivation hole area serves as a junction layer between the S/D metal pattern 540 located beneath the lower transparent electrode pattern 570 and an upper passivation layer (PAS2) located on the S/D metal pattern 540. Accordingly, it may be possible to solve the problems in FIGS. 2A to 2D caused due to the lack of adhesion strength of the S/D metal pattern and an upper passivation layer located above the S/D metal pattern.

After the process of patterning the pixel electrode pattern 570' and the lower transparent electrode pattern 570, a PAS2 580, which is an upper passivation layer, may be patterned on the entire surface of the substrate (see step S455 and refer to FIG. 5D). In other words, a layer of an inorganic insulating material, such as silicon nitride ($SiN_x$), is deposited, and a PAS2 pattern having a predetermined pattern is formed by a photolithography process and a dry etching process using a passivation layer mask.

In step S460, a common voltage electrode pattern, which is an upper transparent electrode layer, is formed on the PAS2. For example, a layer of a transparent conductive material, such as Indium Tin Oxide (ITO) or Indium Zinc Oxide (IZO), is deposited on the entire surface of the substrate, and then a common electrode (Vcom) pattern 590 in the active area is formed by exposure and wet etching using an upper transparent electrode mask or a common electrode mask. The common electrode (Vcom) pattern 590 may have a finger shape for each pixel, as illustrated in FIG. 5E.

Meanwhile, a passivation hole defined in embodiments of the present invention is defined as including all apertures, all holes, and all contact holes which are opened by removing a part of a passivation layer located on a part at which the S/D metal pattern is formed in the non-active area of the array substrate. An additional layer, such as another passivation layer and the like, may be formed in such an area opened by removing the part of the passivation layer.

Purposes of the passivation hole may include measuring a size, measuring an electrical characteristic of an S/D metal pattern, configuring a part of a static electricity prevention circuit, and the like, without being limited thereto.

The respective example purposes are described in more detail as follows. A drain contact hole is formed for exposing a drain electrode included in a TFT in the active area, and it may be necessary to precisely measure the size of the drain contact hole. However, the drain contact hole has a small size, and is formed for each of numerous pixels, and thus it may be difficult to accurately measure sizes of all the drain contact holes. To this end, a passivation hole may be used. As illustrated in FIGS. 5A to 5E, a passivation hole of the non-active area is formed by a process identical to that of forming the drain contact hole in the active area, and a passivation contact hole has a larger size than that of the drain contact hole. Accordingly, when an actual size of the passivation hole against a target size thereof is measured, it is possible to know the degree of precision of the process. Because the degree of precision is identical to that of the process of forming the drain contact hole, it is possible to measure the size (critical dimension) of the drain contact hole.

Meanwhile, the S/D metal pattern may be formed in the passivation hole area, and a part, which needs the S/D metal pattern in the non-active area as described above, is the part connected to a gate metal pattern. Examples of the part include a part connecting a common electrode line (Vcom line) to the active area, a part connecting a gate pad to a gate line in the active area, a part connecting data Integrated Circuit (IC) to a data line in the active area, and the like. As described above, in even the non-active area, there may be many cases in which an aperture needs to be formed above the S/D metal pattern, and the aperture enables the measurement of an electrical characteristic of an S/D metal layer.

In addition, the passivation hole may be used for a dummy pattern for measurement of an electrical characteristic (inserted into a panel portion other than the active area and a mother glass substrate), a pattern for size measurement in which there is an area where layers overlap (e.g., S/D and a PAC), and the like.

Also, the static electricity prevention circuit existing in the non-active area, for example, in a form in which three transistors are connected to each other, needs an aperture for exposing the S/D metal pattern to the outside, and thus a passivation layer aperture according to an embodiment of the present invention may be used in this case.

Meanwhile, the entire process of manufacturing the array substrate according to an embodiment of the present invention as illustrated in FIG. 4 will be summarized below.

Performed are process S405 and S410 of forming a gate metal pattern on the substrate and forming a GI on the gate metal pattern; process S415, S420 and S425 of depositing a semiconductor layer and an S/D layer and forming an S/D metal pattern in both an active area and a non-active area by a photolithography process using one more masks; and process S430, S435 and S440 of depositing a PAS1 and a PAC, which are a lower passivation layer, and forming a passivation hole by removing a part of the lower passivation layer in a passivation hole area.

In addition, the entire process may include the lower transparent electrode patterning process S450 of depositing a pixel electrode layer, which is a lower transparent electrode layer, and forming a lower transparent electrode pattern as an S/D cover layer on the S/D metal pattern in the passivation hole area by using a lower transparent electrode mask; and a process of forming a PAS2, which is an upper passivation layer, on the entire surface on the lower transparent electrode pattern.

FIGS. 6A and 6B are plan views illustrating an array substrate manufactured according to an embodiment of the present invention, and FIGS. 6C and 6D are cross-sectional views illustrating the array substrate manufactured according to an embodiment of the present invention.

As illustrated in FIG. 6A, one or more passivation holes 600 are formed in the non-active area of the array substrate, and the lower transparent electrode pattern 570 as an S/D cover layer is formed in an area of the one or more passivation holes 600 as described above. For example, the lower transparent electrode pattern 570, which may be formed by a process identical to that of forming a pixel transparent electrode (PXL ITO), is formed between an S/D metal pattern of the passivation hole 600 and the passivation layer located above the S/D metal pattern. Accordingly, the lower transparent electrode pattern 570 may serve to prevent a delamination phenomenon of the passivation layer and a phenomenon in which a foreign material is generated.

At this time, the lower transparent electrode pattern 570 may be widely patterned in such a manner as to completely cover an entire area including the multiple passivation holes 600s, as illustrated in FIG. 6A. Alternatively, the lower transparent electrode pattern 570 may be patterned in such a manner as to separate each passivation hole 600 from another passivation hole, as illustrated in FIG. 6B.

Meanwhile, a cross section of a passivation hole, which exists in the non-active area of the array substrate manufactured according to an embodiment of the present invention, is described as follows. With reference to FIG. 6C, the S/D metal pattern 540 formed below the passivation hole is located, and the lower transparent electrode pattern 570 is formed on the S/D metal pattern 540, which is exposed by removing the PAS1 550 and the PAC 560 formed on the S/D metal pattern 540, and the PAS2 580, which is an upper passivation layer, is formed on the lower transparent electrode pattern 570.

Accordingly, as illustrated in FIG. 6D, even when an oxide film 540' is formed on the S/D metal pattern 540 exposed by a process of dry-etching an organic passivation layer and the like, the lower transparent electrode pattern 570 of a conductive material formed on the oxide film 540' serves as a kind of contact mediation layer. Accordingly, it is possible to improve adhesion strength of the S/D metal pattern 540 and the PAS2 580 located above the S/D metal pattern 540.

Therefore, it is possible to suppress the delamination phenomenon of the upper passivation layer caused by the structure illustrated in FIGS. 2A to 2D, for example, the structure in which the S/D metal pattern directly contacts the upper passivation layer in the passivation hole area, the generation of failure due to a passivation foreign material according to the occurrence of the delamination phenomenon, and the like.

Hereinabove, a lower transparent electrode pattern, which is an S/D cover layer existing in the passivation hole area of the non-active area of the display panel, has been described as being formed as a pixel transparent electrode layer (PXL ITO). Alternatively, the lower transparent electrode pattern may be formed as a common electrode layer (Vcom ITO).

FIG. 7 is a cross-sectional view illustrating an example passivation hole area according to an embodiment of the present invention applied to an LCD device of a POT type.

With reference to FIG. 7, in the POT-type display panel in which a transparent pixel electrode is formed on the uppermost part of the substrate, a Vcom ITO pattern 670', which is a transparent electrode for a common voltage, may be patterned on a PAS1 and a PAC, and a common voltage transparent electrode pattern 670 is formed as a lower transparent electrode pattern in a passivation hole area by a process identical to the above-described process. The common voltage transparent electrode pattern 670, which is a Vcom ITO layer, serves as a cover layer of an S/D metal pattern, and thus can improve adhesion strength of the S/D metal pattern and an upper passivation layer (PAS2) as described above.

Meanwhile, in the case of the VOT-type array substrate illustrated in FIG. 4 through FIGS. 6A to 6D, dry etching may be performed after (light) exposure in order to selectively remove a PAS1 and a PAC. In contrast, the POT-type array substrate illustrated in FIG. 7 may be slightly different from the VOT-type array substrate, due to a process of performing development immediately after exposure in order to selectively remove a PAS1 and a PAC.

At this time, the oxidation of an S/D metal pattern exposed to plasma in the dry etching process may be more active than in the development process. In this regard, adhesion strength of an upper passivation layer (PAS2) at a passivation hole may be more severely reduced in the VOT-type display panel illustrated in FIG. 5 than in the POT-type display panel illustrated in FIG. 7. Accordingly, embodiments of the present invention may be more usefully utilized.

However, the oxidation of an S/D metal pattern may not always occur only in the dry etching process, and thus embodiments of the present invention may be applied even to the POT-type display panel illustrated in FIG. 7.

Also, although the oxidation of a metal pattern may not occur, the S/D metal pattern directly contacts the PAS2 different in kind from the S/D metal pattern in the passivation hole area, so that adhesion strength between the S/D metal pattern and the PAS2 may be reduced. Therefore, according to another embodiment of the present invention illustrated in FIG. 7, a lower transparent electrode pattern (e.g., a Vcom ITO layer) is disposed between the S/D metal pattern and the upper passivation layer (PAS2), and thereby inter-layer adhesion strength can be improved.

The above-described respective embodiments of the present invention are not necessarily applied only to the array substrate for the LCD device, and may be applied to all types of substrates for a display device, in which an inorganic passivation layer located on a predetermined metal pattern directly contacts the predetermined metal pattern in a hole area or a contact hole area of a non-active area and thereby adhesion strength between the inorganic passivation layer and the predetermined metal pattern may be weakened. For example, the above-described respective embodiments of the present invention may be applied to all array substrates for an OLED display device, a PDP display device, and the like.

As described above, according to various embodiments of the present invention, a transparent electrode pattern (e.g., ITO) may be formed between an S/D metal pattern and a passivation layer located above the S/D metal pattern, which are formed in the passivation hole area of the non-active area of the array substrate for the display panel. Accordingly, it may be possible to prevent a delamination phenomenon of the passivation layer and a peel-off phenomenon of a passivation foreign material in the passivation hole area.

Further, in an area of a PAS hole or a PAC hole formed on an S/D metal pattern, a transparent electrode pattern for increasing adhesive strength may be formed between the S/D metal pattern and a passivation layer located above the S/D metal pattern. Accordingly, it may be possible to prevent display failure caused by a delamination phenomenon and a peel-off phenomenon of a passivation layer material due to the lack of adhesion strength between a metal pattern and a passsivation layer in the passivation hole area.

For example, in a display panel where an organic passivation layer (PAC) of an organic material, such as photoacryl or the like, is used and a pixel transparent electrode and a common voltage transparent electrode are simultaneously disposed on an array substrate, a transparent electrode pattern may be formed between an S/D metal layer and a passivation layer located above the S/D metal layer existing a passivation hole (PAC hole) area of a non-active area. Accordingly, various problems may be solved which occur when an oxide layer is formed on the S/D metal layer existing in a pad for measurement during a process of dry-etching the PAC, and thus adhesion strength of the metal layer and a passivation layer located above the metal layer is weakened. As a result, it may be possible to increase yield of liquid crystal display panels, and a reduction in failure rate thereof.

According to a result of testing the degree of generation of a hot pixel in a display panel to which an embodiment of the present invention may be applied, as shown in Table 1 below, a generation rate of a hot pixel in an active area reaches 9.08% in a structure where an S/D metal pattern directly contacts a passivation layer (PAS2) located on the S/D metal pattern in a passivation hole area as illustrated in FIGS. 2A to 2D. However, a hot pixel was not generated at all in a case where a pixel transparent electrode (ITO) pattern is formed as an S/D cover layer between an S/D metal pattern and an upper passivation layer PAS2 in a passivation hole area by applying the configuration illustrated in FIGS. 5A to 5E among embodiments of the present invention.

TABLE 1

|  | Structure of FIGS. 2A to 2D (Direct contact between S/D pattern & PAS2) | Embodiment of present invention (FIGS. 5A to 5E) (Formation of PXL covering PTN between S/D pattern & PAS2 layer) |
| --- | --- | --- |
| Generation rate of hot pixel | 9.08% | 0.00% |

While the technical spirit of the present invention has been described by example with reference to the accompanying drawings, it will be understood by a person skilled in the art that the present invention may be varied and modified in various forms without departing from the scope of the present invention. Accordingly, the embodiments disclosed in the present invention are not to limit but merely to describe the technical spirit of the present invention. Further, the scope of the technical spirit of the present invention is not limited by the described embodiments. The scope of the present invention shall be construed on the basis of the accompanying claims in such a manner that all of the technical ideas included within the scope equivalent to the claims belong to the present invention.

What is claimed is:

1. A display device comprising:
   a substrate including an active area and non-active area, the non-active area including a pad area with one or more pads and a dummy area;
   a plurality of gate lines to supply gate signals to a plurality of pixels and a plurality of data lines to supply data signals to the plurality of pixels on the active area;
   a plurality of pixels to display an image in the active area, each of the plurality of pixels including a thin film transistor connected to at least one of the plurality of the date lines and gate lines, and configured to supply a signal to a corresponding pixel;
   a gate pad and data pad connected to at least one of the plurality of the date lines and gate lines on the substrate, the gate pad and data pad being disposed in the pad area;
   a semiconductive layer in the dummy area;
   a conductive layer on the semiconductive layer in the dummy area;
   a passivation layer on the conductive layer in the dummy area;
   an organic layer on the passivation layer in the dummy area; and
   a transparent conductive layer on the organic layer, the transparent conductive layer connected to the conductive layer in the dummy area,
   wherein in the dummy area, the transparent conductive layer is provided as a cover layer of the conductive layer.

2. The display device according to claim 1, wherein:
   the organic layer is formed of an organic material; and
   the organic material is photo-acryl, acrylate, or polyamide.

3. The display device according to claim 1, wherein:
   the passivation layer is formed of an inorganic material; and
   the inorganic material is silicon nitride or silicon oxide.

4. The display device according to claim 1, further comprising a gate insulator disposed under the semiconductor layer in the dummy area.

5. The display device according to claim 1, wherein the organic layer is thicker than the passivation layer.

6. The display device according to claim 1,
   wherein the dummy area further comprises:
   a plurality of passivation holes in the organic layer at the conductive layer.

7. The display device according to claim 6, wherein the plurality of passivation holes are formed in the passivation layer at the conductive layer.

8. The display device according to claim 7, wherein the transparent conductive layer directly contacts the conductive layer in each of the passivation holes.

9. The display device according to claim 1,
   wherein the thin film transistor includes a gate metal pattern, a gate insulator, the semiconductor layer, a source/drain metal pattern, a lower passivation layer, a lower transparent electrode layer, a upper passivation layer, and an upper transparent electrode layer that are sequentially disposed.

10. The display device according to claim 9, wherein the transparent conductive layer and the lower transparent electrode layer are formed as a same layer.

11. The display device according to claim 9, wherein the lower transparent electrode layer is a common voltage electrode disposed on the lower passivation layer in the active area,
    wherein the common voltage electrode and the transparent conductive layer are formed as a same layer.

12. The display device according to claim 9, wherein each of the source/drain metal pattern and the gate metal pattern is formed of one or more materials selected from copper, copper alloy, aluminum, aluminum alloy, molybdenum, and molybdenum alloy.

13. The display device according to claim 9, wherein the source/drain metal pattern formed in the active area includes a source electrode and a drain electrode.

14. The display device according to claim 13, wherein the semiconductor layer is disposed to form a channel between the source electrode and the drain electrode.

15. The display device according to claim 9, wherein in the active area, the lower transparent electrode layer is disposed to form a pixel electrode.

16. The display device according to claim 15, wherein the pixel electrode in the active area and the transparent conductive layer in the dummy area are formed as a same layer.

17. A display device comprising:
    a substrate including an active area and non-active area, the non-active area including a pad area with one or more pads and a dummy area;
    a plurality of gate lines to supply gate signals to a plurality of pixels and a plurality of data lines to supply data signals to the plurality of pixels on the active area;
    a plurality of pixels to display an image in the active area, each of the plurality of pixels including a thin film transistor connected to at least one of the plurality of the date lines and gate lines, and configured to supply a signal to a corresponding pixel;

a gate pad and data pad connected to at least one of the plurality of the date lines and gate lines on the substrate, the gate pad and data pad being disposed in the pad area;

a semiconductive layer in the dummy area;

a conductive layer on the semiconductive layer in the dummy area;

a passivation layer on the conductive layer in the dummy area;

an organic layer on the passivation layer in the dummy area;

a transparent conductive layer on the organic layer, the transparent conductive layer connected to the conductive layer in the dummy area; and an upper passivation layer on the transparent conductive layer in the dummy area.

* * * * *